(12) United States Patent
Toutounchi et al.

(10) Patent No.: US 6,594,610 B1
(45) Date of Patent: Jul. 15, 2003

(54) FAULT EMULATION TESTING OF PROGRAMMABLE LOGIC DEVICES

(75) Inventors: Shahin Toutounchi, Pleasanton, CA (US); Anthony P. Calderone, Soquel, CA (US); Zhi-Min Ling, Cupertino, CA (US); Robert D. Patrie, Scotts Valley, CA (US); Eric J. Thorne, Santa Cruz, CA (US); Robert W. Wells, Cupertino, CA (US)

(73) Assignee: Xilinx, Inc., San Jose, CA (US)

( * ) Notice: Subject to any disclaimer, the term of this patent is extended or adjusted under 35 U.S.C. 154(b) by 137 days.

(21) Appl. No.: 09/853,351

(22) Filed: May 11, 2001

Related U.S. Application Data
(60) Provisional application No. 60/271,005, filed on Feb. 21, 2001.

(51) Int. Cl.[7] .............................................. G06F 19/00
(52) U.S. Cl. .................... 702/117; 702/58; 702/123; 702/183; 703/14; 703/27; 714/2; 714/30; 714/39; 714/725; 716/4; 716/17
(58) Field of Search .......................... 702/58–59, 117, 702/119, 123, 124, 183, 185, 189, FOR 103, 104, 134, 170; 711/6, 134, 138; 703/23, 27–28, 500, 13–16; 714/725, 724, 741, 738; 716/1–7, 12–13, 16–18, FOR 489, 490

(56) References Cited

U.S. PATENT DOCUMENTS

| | | | |
|---|---|---|---|
| 5,633,813 A | | 5/1997 | Srinivasan |
| 5,717,699 A | * | 2/1998 | Haag et al. .................. 371/22.2 |
| 6,223,148 B1 | * | 4/2001 | Stewart et al. ................ 703/25 |
| 6,405,334 B1 | * | 6/2002 | Tien ............................ 714/725 |

OTHER PUBLICATIONS

Hong et al., An FPGA–Based Hardware Emulator For Fast Fault Emulation Jan. 1997, 0–7803–3636–4/97, pp. 345–348.*

Xilinx; XAPP216 (v1.0); "Correcting Single–Event Upsets Through Virtex Partial Configuration"; Jun. 1, 2000; available from Xilinx, Inc., 2100 Logic Drive, San Jose, California 95124.

Cheng, Kwang–Ting; "Fault Emulation: A New Methodology for Fault Grading"; 1999 IEEE; pp. 1487–1495.

Harris, Ian G. et al.; "Interconnect Testing in Cluster–Based FPGA Architectures"; DAC 2000, Los Angeles, California; pp. 4954.

* cited by examiner

Primary Examiner—Marc S. Hoff
Assistant Examiner—Elias Desta
(74) Attorney, Agent, or Firm—H. C. Chan

(57) ABSTRACT

A new testing method uses a field programmable gate array to emulate faults, instead of using a separate computer to simulate faults. In one embodiment, a few (e.g., two or three) known good FPGAs are selected. A fault is introduced into the design of a FPGA configuration. The configuration is loaded into the FPGAs. A test vector is applied and the result is evaluated. If the result is different from that of a fault-free configuration, the fault is caught. One application of this method is to evaluate fault coverage. A fault model that can be used in the present invention is disclosed.

24 Claims, 6 Drawing Sheets

FAULT EMULATION TESTING OF PROGRAMMABLE LOGIC DEVICES

FIELD OF THE INVENTION

This invention relates to testing of integrated circuits, and more specifically to a method for testing programmable logic devices using fault emulation.

BACKGROUND OF THE INVENTION

Programmable logic devices exist as a well-known type of integrated circuit (IC) that may be programmed by a user to perform specified logic functions. There are different types of programmable logic devices, such as programmable logic arrays (PLAs) and complex programmable logic devices (CPLDs). One type of programmable logic devices, called the field programmable gate array (FPGA), is very popular because of a superior combination of capacity, flexibility and cost. A FPGA typically includes an array of configurable logic blocks (CLBs) surrounded by a ring of programmable input/output blocks (IOBs). The CLBs and IOBs are interconnected by a programmable interconnect switch matrix structure. The CLBs, IOBs, and interconnect structure are typically programmed by loading a stream of configuration data (bitstream) into internal configuration memory cells that define how the CLBs, IOBs, and interconnect structure are configured. The configuration data is typically organized into frames. The configuration bitstream may be read from an external memory (e.g., an external PROM). The collective states of the individual memory cells then determine the function of the FPGA.

A typical FPGA is a very complex IC device. For example, some FPGAs in the Virtex-II family, marketed by Xilinx, Inc. of San Jose, Cailf., contain several million gates. In addition, there are millions of interconnect lines. A FPGA may be unusable when some of the gates or interconnect lines malfunction (e.g., due to fabrication errors, fabrication defects, or physical failure). Thus, it is important to test the FPGA to determine if there are defects.

An important problem in testing is test evaluation (or test grading), which is the determining of the effectiveness, or quality, of a test. Test evaluation is usually done in the context of a fault model, i.e., a model representing physical defects that may cause failure (e.g., not meeting specification). A popular fault model assumes that circuit nodes can be "stuck" at "one" or "zero". The quality of a test is measured by the ratio between the number of faults it detects and the total number of faults in the assumed universe of the model. This ratio is referred to as the "fault coverage."

In IC technology, testing is an experiment in which an IC is exercised (e.g., by applying a test vector to some or all of the inputs of the IC) and its resulting response is analyzed to ascertain whether it behaves properly. An important tool of testing is fault simulation. It consists of simulating (using a digital computer such as a workstation) a circuit in the presence of faults. By comparing the fault simulation results between a circuit with and without faults (against the same applied test vector), one can determine the effectiveness of a testing procedure. An extensive amount of research and development has been conducted in fault simulation. Some of the ideas and results are summarized in a book entitled "Digital Systems Testing and Testable Design," written by Miron Abramovici, et. al., and copyrighted in 1990 by AT&T.

Fault simulation can be used as a tool to perform fault grading. Typically, it involves many hours of computer simulation time. For example, fault simulation of a small FPGA, such as a part called XCV50, a member of the Virtex family of products available from Xilinx, Inc., involves over 1,500 CPU hours of computer time on an Ultra II SparcStations. The XCV50 is a relatively small FPGA. It has about 60,000 system gates (versus over a million in the bigger FPGAs). Thus, it will be very time consuming (thereby expensive) to use fault simulation for fault grading for large FPGAs.

It should be noted that fault grading is the foundation for many other activities, such as effective diagnosis, test generation automation, etc. Thus, it is advantageous to devise an alternative method for fault grading that does not involve prolonged operations.

SUMMARY OF THE INVENTION

The present invention involves a new method to perform testing of programmable logic devices. It uses-a programmable logic device (such as a FPGA) to emulate faults, instead of using a separate computer to simulate faults. In one embodiment, a few (e.g., two or three) known good FPGAS are selected. A fault is introduced into the design of a FPGA configuration. The configuration is loaded into the FPGAS. A test vector is applied and the result is evaluated. If the result is different from that of a fault-free configuration, the fault is caught. One application of this method is to evaluate fault coverage.

One fault model that can be advantageously used in the present invention is disclosed. In this model, programmable routing matrixes are modeled with open/short faults, and pairs of lines are divided into "connectable" and "non-connectable." A pair of non-connectable lines means that two lines are not supposed to be connected in a fault-free FPGA. A pair of connectable lines means that a user of the FPGA has the flexibility of programming them to be either open or connected (i.e., shorted). The possible faults in this model are: (a) two connectable lines may be permanently shorted, or permanently open, and (b) two non-connectable lines may be permanently shorted. In one embodiment, the programmable interconnection point (PIP) of a FPGA can be used as the emulation element for open and shorts. Since the control memory cell is independently programmable, the PIP can be used to emulate "faulty" circuits. Turning on a PIP that is supposed to be off in a configuration emulates a "short". Turning off a PIP that is supposed to be on in a configuration emulates an "open". Under assumptions that are easily met in FPGAs, emulating a short to non-connectable line means emulating the short to a known state.

The above summary of the present invention is not intended to describe each disclosed embodiment of the present invention. The figures and detailed description that follow provide additional example embodiments and aspects of the present invention.

DETAILED DESCRIPTION OF THE INVENTION

The present invention relates to testing of programmable logic devices. In the following description, numerous specific details are set forth in order to provide a more thorough understanding of the present invention. However, it will be apparent to one skilled in the art that the present invention may be practiced without these specific details. In other instances, well-known features have not been described in detail in order to avoid obscuring the present invention.

Figure 1:
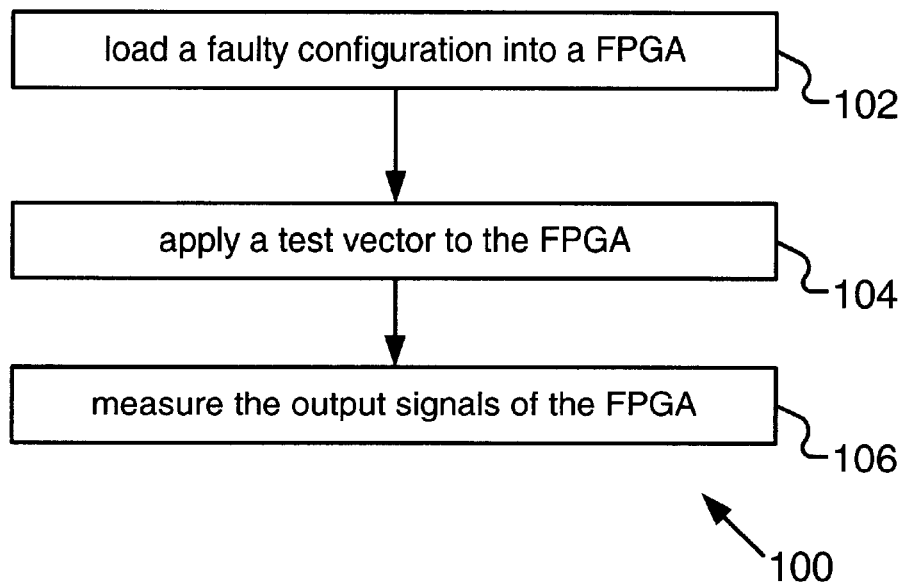
FIG. 1 is a flow chart showing a fault emulation method of the present invention.

The present invention uses programmable logic devices (such as FPGAs) to emulate faults, instead of using a separate computer (e.g., a workstation) to simulate faults. FIG. 1 shows a flow chart 100 of a fault emulation method of the present invention. In step 102, a FPGA configuration containing faults is loaded into a FPGA. In this step, a FPGA configuration is composed of two types of elements: (a) logic elements, which are the building blocks to implement circuit designs, and (b) the connectivity between logic elements. The logic elements comprise a plurality of CLBs and IOBs that can be programmed to perform user-defined functions. The connectivity is accomplished by turning "on" or "off" the appropriate switches in the switch matrix. In the present invention, emulated faults are used to represent physical faults by configuring the FPGA in a certain way. A fault model is employed to link emulated faults to physical faults. Details of a preferred fault model will be described below.

In step 104, a test vector is applied to some or all input pins of the FPGA. In step 106, the output signals from the FPGA are measured. These output signals are used to evaluate the test. For example, if there is no differences in the output signals between configurations with and without faults, the test may not be acceptable because it cannot catch the fault.

The total time for configuring the FPGA and then generating the output signals in response to the test vector is very short. In some cases, it could be less than a minute. This is because the test is run at the hardware speed of the FPGA. In contrast, running a computer fault simulation could take more than an hour. Thus, fault emulation is a much faster method to evaluate tests.

Figure 2:
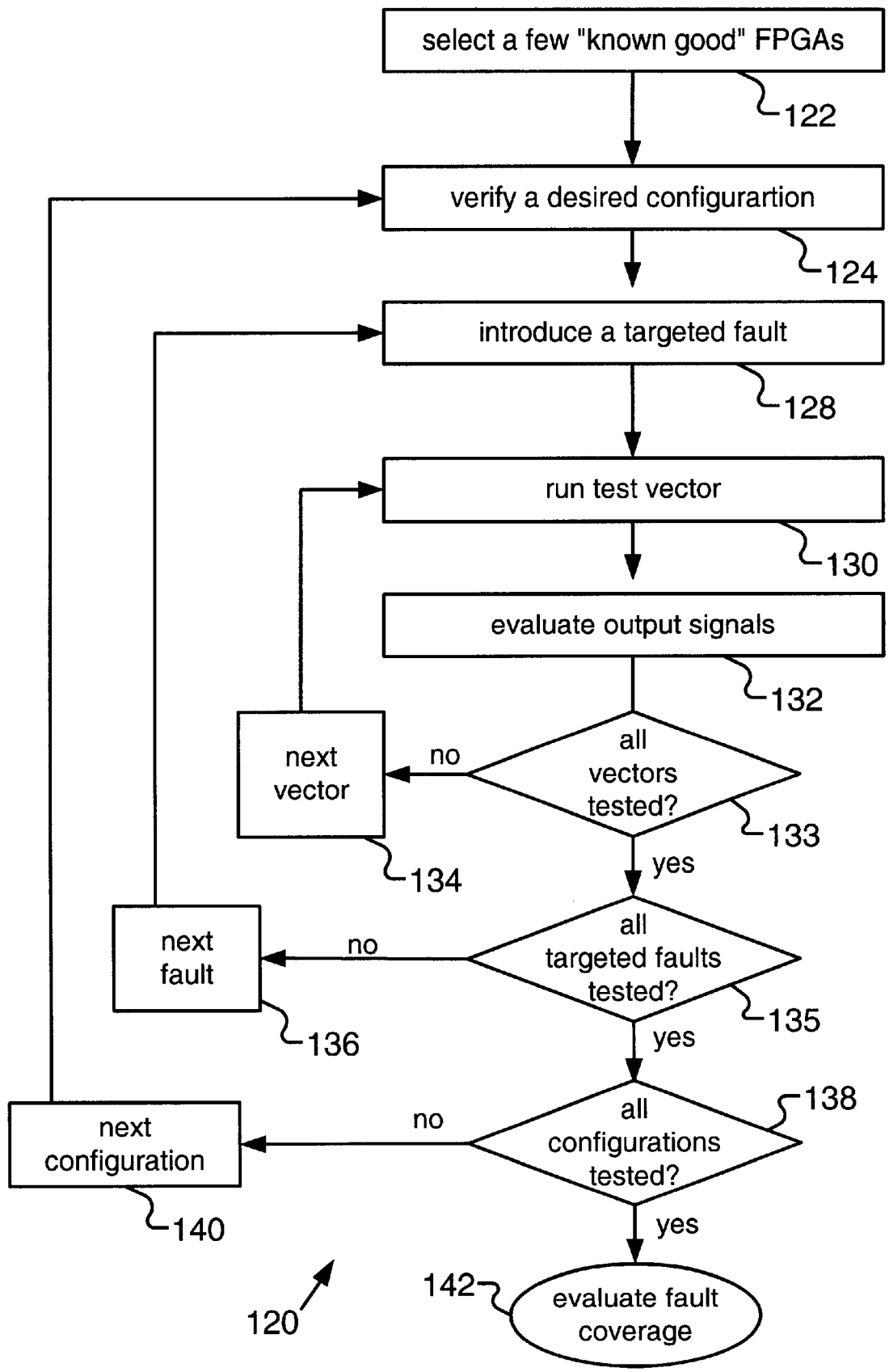
FIG. 2 is a flow chart showing an application of the fault emulation method of the present invention in test grading.

FIG. 2 is a flow chart 120 showing an application of the fault emulation method of the present invention in test grading. In step 122, a small number of FPGAs that are known to be good are selected. In some cases, just two to three known good parts are sufficient. Tests will be conducted on these FPGAs and the results compared. In one embodiment, the results are accepted if all the FPGAs show the same results. In another embodiment, the results are still accepted if a large percentage of FPGAs show the same results (an example is a majority rule criterion). Note that these "known good" parts do not have to be perfect. This is because the probability that exactly the same real and random faults repeat in all samples on the same test vector and the same configuration is statistically negligible. On the other hand, parts that are perfect or close to perfect could increase the confidence and efficiency of the evaluation.

In step 124, a desired configuration is loaded into the FPGAs. A set of test vectors is applied. The purpose of this step is to ensure that the configuration actually works. In step 128, a predetermined fault (called the targeted fault) is selected for testing. A configuration with the fault is loaded into the FPGAs. In step 130, the set of test vectors is run on the faulty configuration. In step 132, the output signals of the FPGAs are evaluated to determine if the test vectors can catch the fault. In this evaluation, the results of the different FPGAs are taken into account using a predetermined criterion (e.g., majority rule). In step 133, it is determined whether all the vectors have been tested. If not all have been tested, the next vector is used (step 134). In step 135, it is determined whether the complete set of targeted faults has been tested. If not all have been tested, the current fault is reversed and the next fault in the list of targeted faults is used (step 136). If all targeted faults have been tested, it is determined whether all the configurations have been tested (step 138). If not all the configurations have been tested, the next configuration is used (step 140). If all the configurations have been tested, the fault coverage is then calculated based on the results of the above mentioned steps in flow chart 120 (step 142).

It should be noted that the targeted faults for different configurations can overlap. Some faults that are not caught by one configuration can be covered by another configuration. All faults should preferably be covered by at least one configuration. If a fault consistently escapes detection, the fault is not covered.

Figure 3:
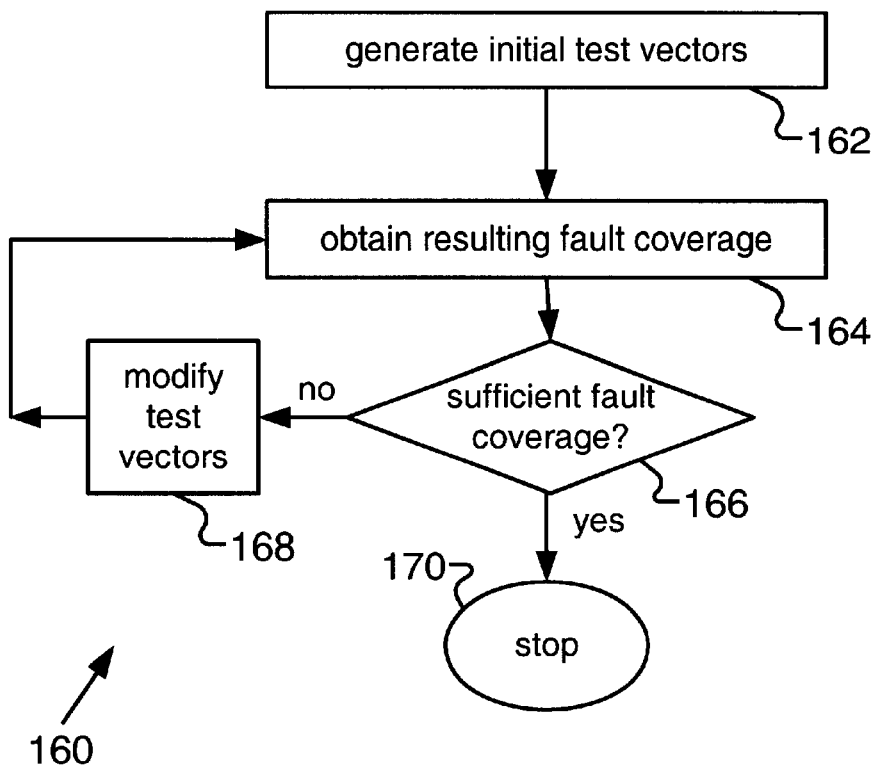
FIG. 3 is a flow chart showing an application of the fault emulation method of the present invention in test generation.

FIG. 3 is a flow chart 160 showing an application of the fault emulation method of the present invention in test vector generation. In step 162, an initial set of test vectors is generated. In step 164, the steps described in connection with FIG. 2 are performed to evaluate the resulting fault coverage. In step 166, the resulting fault coverage is evaluated to determine if the coverage is sufficient. If it is not sufficient, the set of test vectors is modified (step 168), and steps 164 and 166 are performed again. If the fault coverage is sufficient, the set of test vectors is accepted and flow chart 160 terminates.

Figure 4:
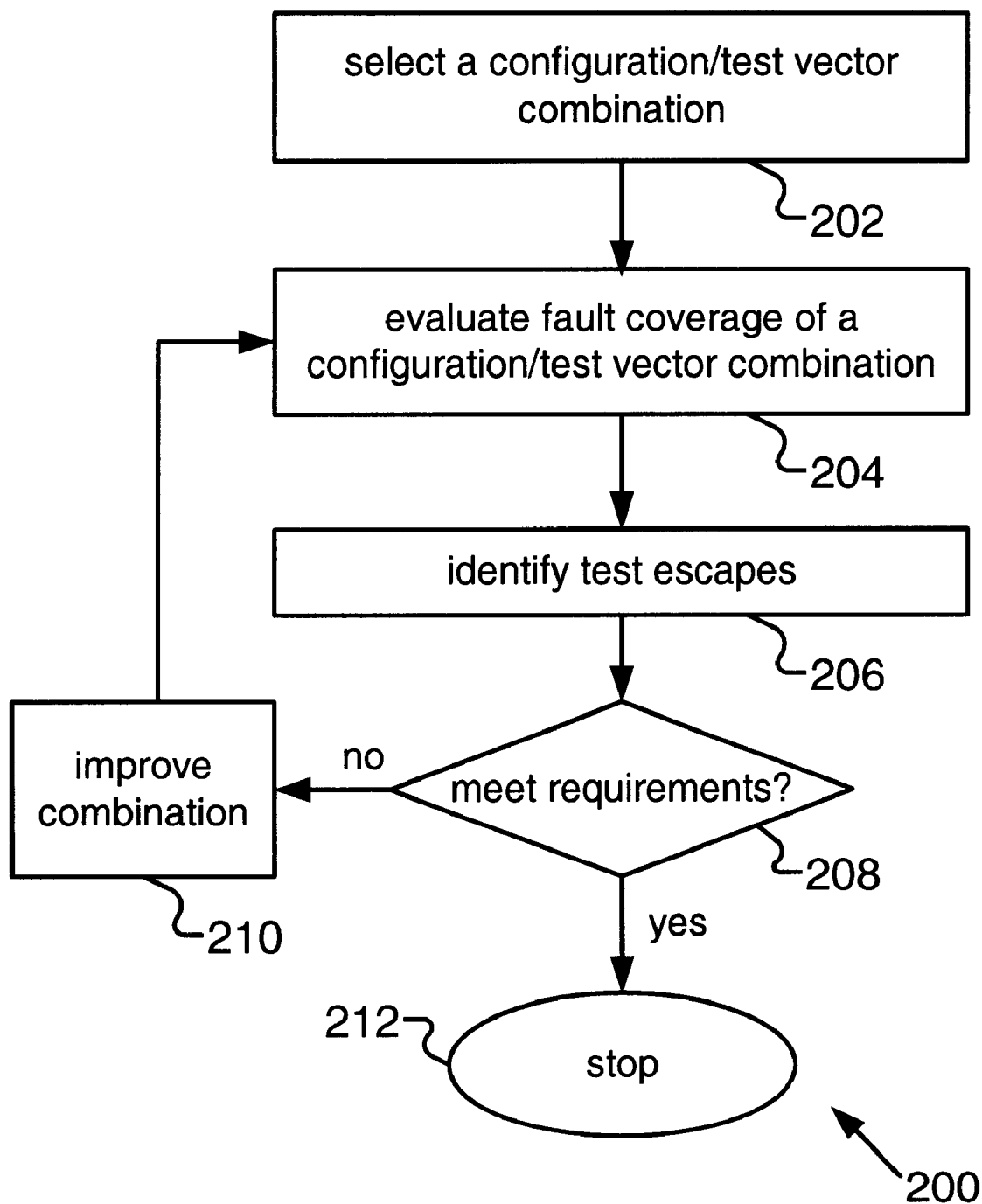
FIG. 4 is a flow chart showing an application of the fault emulation method of the present invention to develop testing combinations to achieve a desirable fault coverage.

FIG. 4 is a flow chart 200 showing an application of the fault emulation method to develop testing combinations to achieve a desirable fault coverage. In step 202, a combination of configuration and test vectors is selected. In step 204, the fault coverage of this combination is evaluated using the method disclosed in FIG. 2. In step 206, test escapes are identified. A test escape is a fault that cannot be caught by this combination. In step 208, this combination is evaluated to determine if it meets predetermined requirements. If it does not meet the requirements, an improved combination is designed (step 210), and steps 204, 206 and 208 are repeated. If it meets the requirements, the combination is satisfactory and flow chart 200 terminates (step 212).

A fault model that can be advantageously used in the present invention is now described. In this model, programmable routing matrixes are modeled with open/short faults, and pairs of lines are divided into "connectable" and "non-connectable." A pair of non-connectable lines means that the lines are not supposed to be connected in a fault-free FPGA. A pair of connectable lines means that a user of the FPGA has the flexibility of programming them to be either open or connected (i.e., shorted). The possible faults in this model are: (a) two connectable lines may be permanently shorted, or permanently open, and (b) two non-connectable lines may be permanently shorted.

The above described fault model lends itself very naturally to emulation. The PIPs of a FPGA can be used as the emulation element for open and shorts. Since the control memory cell is independently programmable, the PIP can be used to emulate "faulty" circuits. Turning on a PIP that is supposed to be off in a configuration emulates a "short".

Turning off a PIP that is supposed to be on in a configuration emulates an "open". Thus, faults in connectable lines can be easily emulated.

Figure 5A:
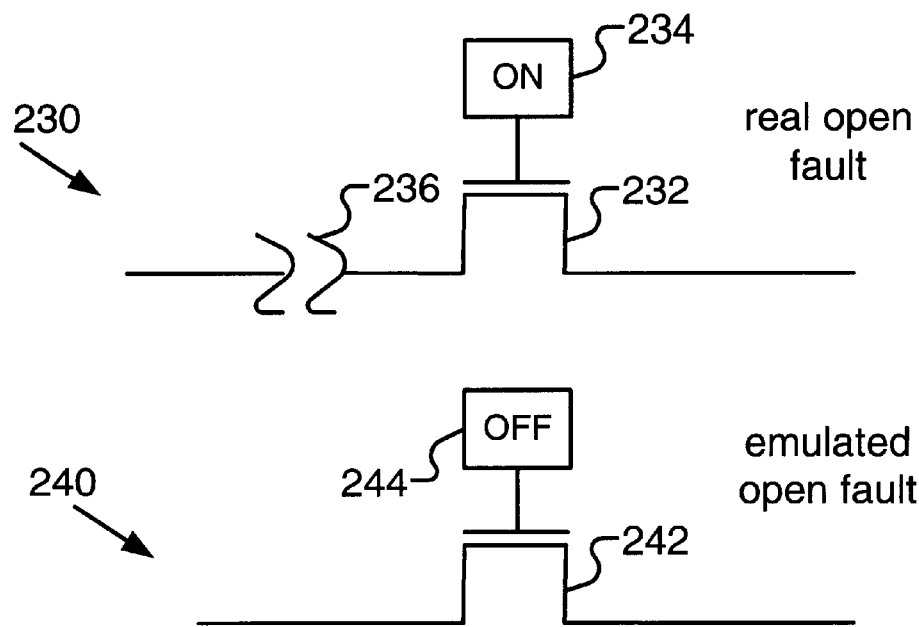
FIGS. 5A–5C show schematic diagrams of fault models of the present invention.

FIG. 5A is a schematic diagram of an example of this fault model. It shows a FPGA circuit 230 having a real open fault. Circuit 230 contains a PIP 232 that is controlled by a memory cell 234. Under normal condition, the state of cell 234 is "ON". A real fault 236 is present in circuit 230. Circuit 230 can be emulated by a circuit 240 that has a PIP 242 and a memory cell 244. In the emulation, cell 244 is set to an "OFF" state.

Figure 5B:
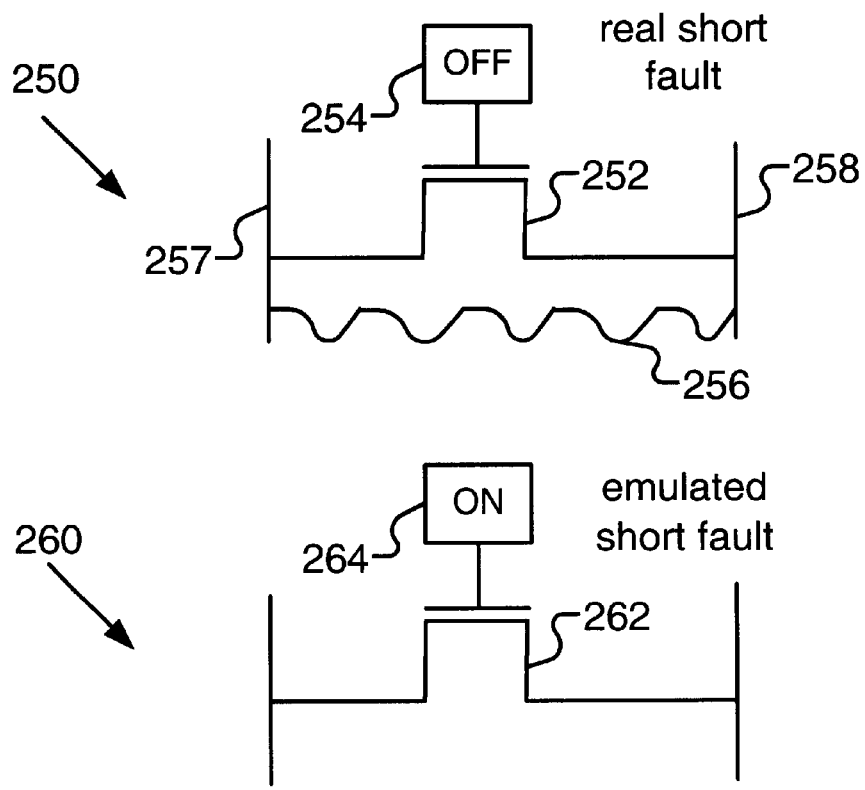

FIG. 5B is a schematic diagram of another example of this fault model. It shows a FPGA circuit 250 having a real short fault. Circuit 250 contains a PIP 252 that is controlled by a memory cell 254. Under normal condition, the state of cell 254 is "OFF". Thus, the lines 257 and 258 are normally not connected. A real fault 256 is present in the circuit, which renders lines 257 and 258 connected. Circuit 250 can be emulated by a circuit 260 that has a PIP 262 and a memory cell 264. In the emulation, cell 264 is set to an "ON" state.

The present model is further refined to handle non-connectable lines. A first step is to remove the assumption that any pair of lines can short to any other pair. This assumption is often physically unrealized. Further, it gives rise to too many unrealistic possibilities. As a result, a large number of unnecessary emulation needs to be performed. Consequently, it will take a long time to develop tests and conduct test grading. The present fault model makes some restrictions so as to simplify the problems:

Two non-connectable lines can short only if they are physical neighbors at the same metal layer.

All "unused" lines are driven to a known logical state.

In a test configuration that targets the testing of "shorts" in a pair of non-connectable neighboring lines, one of the lines must be an "unused".

Figure 5C:
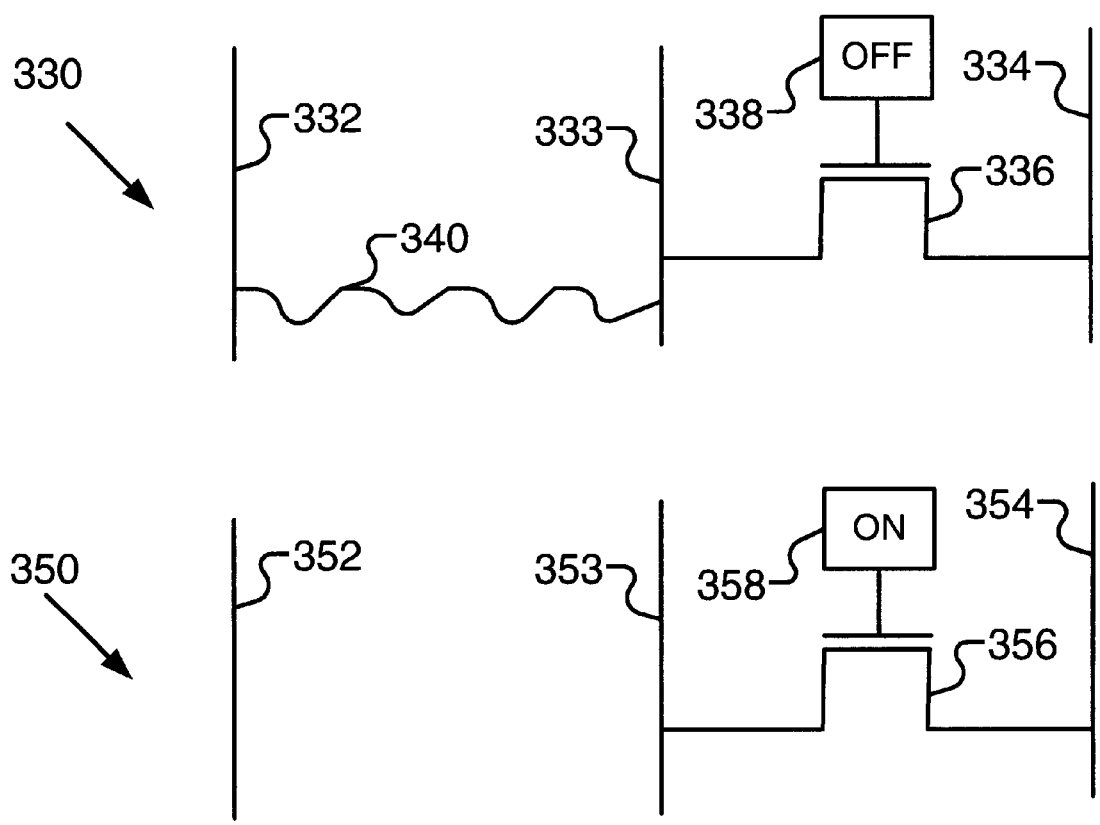

Under these restrictions, testing a short to non-connectable line means testing the short to a known state. FIG. 5C illustrates this fault model. It shows a FPGA circuit 330 that contains a pair of non-connectable lines 332 and 333 (which are unused and driven to a known state). Line 333 is the wire under test. It is connectable to another line 334 through a PIP 336 that is controlled by a memory cell 338. In circuit 330, the status of cell 338 is OFF. Thus, line 333 is normally not connected to another line. Circuit 330 may contain a real short fault 340. In this case, line 333 is connected to another line. Circuit 330 can be emulated by another circuit 350. It contains three lines 352, 353 and 354. Lines 352-354 correspond to lines 332-334 of circuit 330. Lines 353 and 354 are connected by a PIP 356 that is controlled by a memory cell 358. In circuit 350, the status of cell 358 is ON. As a result, lines 354 and 353 are connected. Thus, the line under test is connected to another line.

In real silicon, almost all the observed shorts are physical neighbors at the same metal layer. Thus, restriction (a) above is a realistic restriction. Restriction (b) is met in many FPGA products. For example, All FPGAs marketed by Xilinx, Inc. meet this restriction. Restriction (c) is also easily met because only 4% to 10% of the resources of a FPGA are used in a typical configuration.

This realistic and simple fault model can be used in the steps of FIGS. 1–4. It serves to simplify the modeling of faults in a configuration and reduce the time for testing. It should be noted that other types of fault models may also be used in the steps of FIGS. 1–4.

Figure 6:
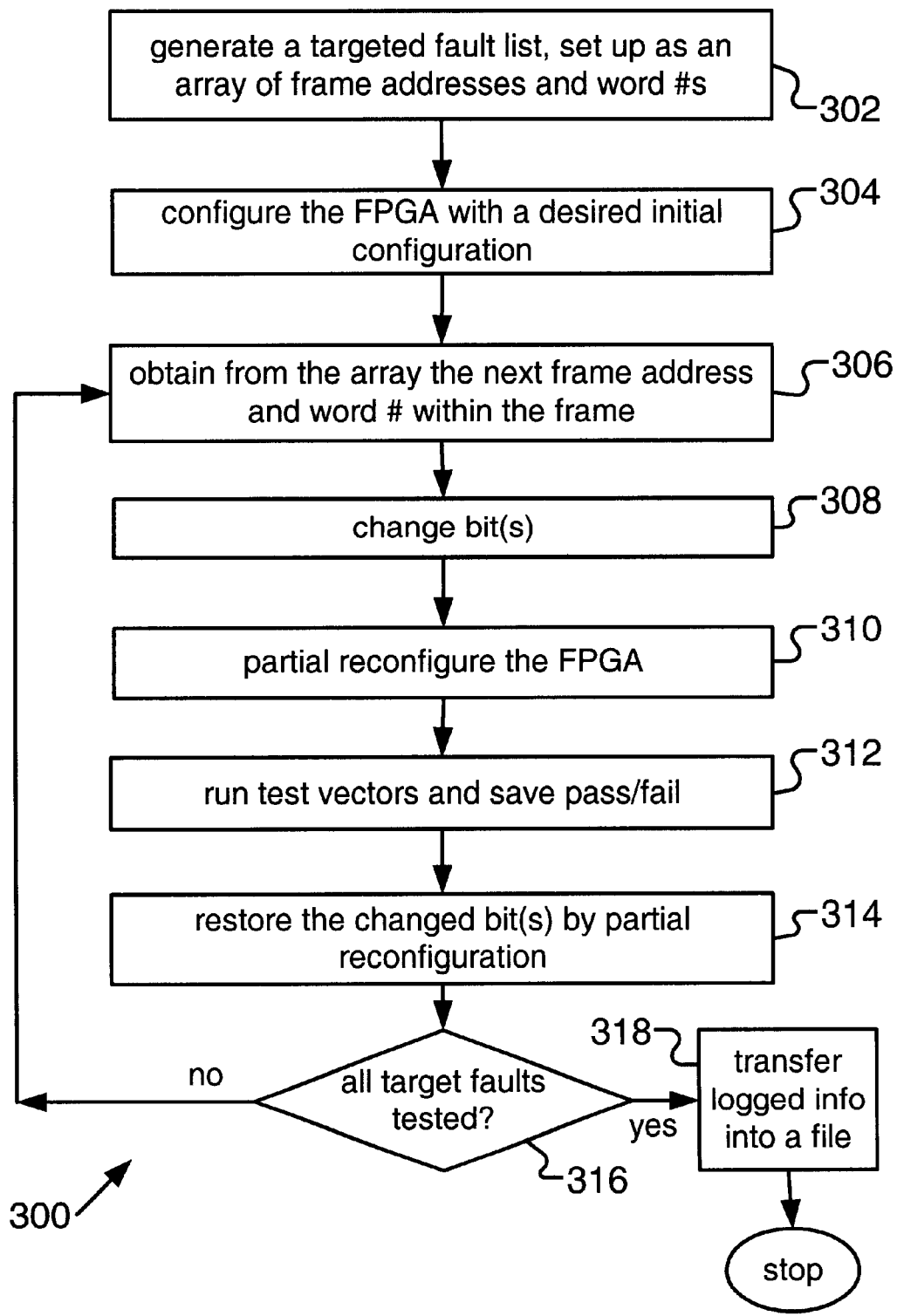
FIG. 6 is a flow chart to show the application of partial reconfiguration of the present invention.

In a preferred embodiment of the present invention, partial reconfiguration is used. Partial reconfiguration speeds up configuration of a FPGA if only a small number of bits is changed. Details of partial reconfiguration have been described in a publication entitled "Correcting Single-Event Upsets Through Virtex Partial Configuration" published by Xilinx, Inc., of San Jose, Calif., in June, 2000. FIG. 6 is flow chart 300 showing the steps for applying partial reconfiguration to the present invention. In step 302, a targeted fault list is generated. Using the above-described fault model, faults in the list are described by the position and state of bits in a FPGA. This information can be stored as an array in the random access memory (RAM) of a testing device. The array can be organized according to frame addresses and word numbers of a FPGA. In step 304, the FPGA is configured with a desired initial configuration. In step 306, the array is read. The frame address and the word number in the frame of the current targeted fault are retrieved from the array. In some cases, only one bit is changed. However, it is also possible that multiple number of bits may be changed. In step 308, the selected bit(s) is changed. In step 310, the FPGA is partially reconfigured. In step 312, test vectors are run, and the result (pass or fail) is saved in the array. In step 314, the changed bit(s) is restored to its original state, and the FPGA returns to the initial configuration using partial reconfiguration. In step 316, it is determined whether all the targeted faults have been tested. If all have been tested, the saved information in the array is transferred to a file in nonvolatile memory, such as hard drive (step 318). The information can be reviewed and further processed by a user. If not all targeted faults have been tested, flow chart 300 routes back to step 306 to repeat the process.

It can be seen from the above description that a novel fault emulation method has been disclosed. Those having skill in the relevant arts of the invention will now perceive various modifications and additions which may be made as a result of the disclosure herein. Accordingly, all such modifications and additions are deemed to be within the scope of the invention, which is to be limited only by the appended claims and their equivalents.

We claim:

1. A method for evaluating testing, comprising the steps of:
   selecting at least two substantially identical programmable logic devices;
   emulating a fault in accordance with predetermined rules;
   modifying a configuration using said fault;
   configuring said at least two programmable logic devices using said modified configuration;
   performing the following steps to each of said at least two programmable logic devices:
   applying a test vector; and
   obtaining output signals in response to said test vector; and
   determining whether said fault is detected based on said output signals obtained from said each of said at least two programmable logic devices.

2. The method of claim 1 wherein each of said at least two programmable logic devices contains at least one programmable interconnection point that can be turned on and off, and wherein said emulating step comprises a step of turning on said programmable interconnection point that is supposed to be off without said fault.

3. The method of claim 1 wherein each of said at least two programmable logic devices contains at least one programmable interconnection point that can be turned on and off, and wherein said emulating step comprises a step of turning off said programmable interconnection point that is supposed to be on without said fault.

4. The method of claim 1 wherein each of said at least two programmable logic devices contains at least two non-connectable lines, and wherein said emulating step comprises a step of introducing said fault only if said two non-connectable lines are physically neighbors at same metal layer.

5. The method of claim 4 wherein said fault is emulated by turning on a programmable interconnection point positioned between said non-connectable lines.

6. The method of claim 1 wherein each of said at least two programmable logic devices contains at least one non-connectable line, and wherein said emulating step comprises a step of setting said non-connectable line to a predetermined state.

7. The method of claim 1 wherein said configuring step comprises a step of partially reconfiguring.

8. The method of claim 7 wherein each of said at least two programmable logic devices contains at least one programmable interconnection point that can be turned on and off, and wherein said emulating step comprises a step of turning on said programmable interconnection point that is supposed to be off without said fault.

9. The method of claim 7 wherein each of said at least two programmable logic devices contains at least one programmable interconnection point that can be turned on and off, and wherein said emulating step comprises a step of turning off said programmable interconnection point that is supposed to be on without said fault.

10. The method of claim 7 wherein each of said at least two programmable logic devices contains at least two non-connectable lines, and wherein said emulating step comprises a step of introducing said fault only if said two non-connectable lines are physically neighbors at same metal layer.

11. The method of claim 10 wherein said fault is emulated by turning on a programmable interconnection point positioned between said non-connectable lines.

12. The method of claim 7 wherein each of said at least two programmable logic devices contains at least one non-connectable line, and wherein said emulating step comprises a step of setting said non-connectable line to a predetermined state.

13. A method of determining fault coverage, comprising the steps of:

selecting at least two substantially identical programmable devices;

developing a set of configurations;

developing a set of target faults in accordance with predetermined rules;

modifying a configuration in said set of configurations using one of said target faults;

configuring said at least two programmable devices using said modified configuration;

applying a test vector to said at least two programmable devices;

obtaining from said at least two programmable devices output signals in response to said test vector;

repeating said modifying, configuring, applying and obtaining steps until all members of said set of target faults have been used;

repeating said modifying, configuring, applying and obtaining steps until all members of said set of configurations have been used; and evaluating said fault coverage based on said output signals generated by using all members of said set of target faults and said set of configurations.

14. The method of claim 13 wherein each of said at least two programmable logic devices contains at least one programmable interconnection point that can be turned on and off, and wherein said emulating step comprises a step of turning on said programmable interconnection point that is supposed to be off without said fault.

15. The method of claim 13 wherein each of said at least two programmable logic devices contains at least one programmable interconnection point that can be turned on and off, and wherein said emulating step comprises a step of turning off said programmable interconnection point that is supposed to be on without said fault.

16. The method of claim 13 wherein each of said at least two programmable logic devices contains at least two non-connectable lines, and wherein said emulating step comprises a step of introducing said fault only if said two non-connectable lines are physically neighbors at same metal layer.

17. The method of claim 16 wherein said fault is emulated by turning on a programmable interconnection point positioned between said non-connectable lines.

18. The method of claim 13 wherein each of said at least two programmable logic devices contains at least one non-connectable line, and wherein said emulating step comprises a step of setting said non-connectable line to a predetermined state.

19. The method of claim 13 wherein said configuring step comprises a step of partially reconfiguring.

20. The method of claim 19 wherein each of said at least two programmable logic devices contains at least one programmable interconnection point that can be turned on and off, and wherein said emulating step comprises a step of turning on said programmable interconnection point that is supposed to be off without said fault.

21. The method of claim 19 wherein each of said at least two programmable logic devices contains at least one programmable interconnection point that can be turned on and off, and wherein said emulating step comprises a step of turning off said programmable interconnection point that is supposed to be on without said fault.

22. The method of claim 19 wherein each of said at least two programmable logic devices contains at least two non-connectable lines, and wherein said emulating step comprises a step of introducing said fault only if said two non-connectable lines are physically neighbors at same metal layer.

23. The method of claim 22 wherein said fault is emulated by turning on a programmable interconnection point positioned between said non-connectable lines.

24. The method of claim 19 wherein each of said at least two programmable logic devices contains at least one non-connectable line, and wherein said emulating step comprises a step of setting said non-connectable line to a predetermined state.

* * * * *